United States Patent [19]
Hayden et al.

[11] Patent Number: 5,101,257
[45] Date of Patent: Mar. 31, 1992

[54] SEMICONDUCTOR DEVICE HAVING MERGED BIPOLAR AND MOS TRANSISTORS AND PROCESS FOR MAKING THE SAME

[75] Inventors: James D. Hayden; Thomas C. Mele; Frank K. Baker, all of Austin, TX

[73] Assignee: Motorola, Inc., Schaumburg, Ill.

[21] Appl. No.: 724,285

[22] Filed: Jul. 1, 1991

[51] Int. Cl.$^5$ .............. H01L 27/02; H01L 21/265
[52] U.S. Cl. .................. 357/43; 357/23.4; 357/23.9; 357/34; 357/59; 437/29; 437/31; 437/41; 437/43; 437/191; 437/196
[58] Field of Search .......... 357/23.4, 23.9, 34, 357/43, 59; 437/29, 31, 41, 43, 191, 196

[56] References Cited

U.S. PATENT DOCUMENTS 4,786,961 11/1988 Avery .................. 357/43
4,868,135 9/1989 Ogura et al. ............ 437/31

OTHER PUBLICATIONS

"A Bipolar-PMOS Merged Basic Cell for 0.8um Bicmos Sea-Of-Gates," by T. Hanibuchi et al. IEEE 1990 Custom Integrated Circuits Conference, pp. 4.2.1–4.2.4, Dec. 9–12, 1990.
"Merged Bipolar-CMOS Device", (author unknown) IBM Technical Disclosure Bulletin, vol. 28, No. 8, Jan. 1986, pp. 3558–3561.
The Stanford Bicmos Project, published by Center for Integrated Systems Stanford Universi Pertinent Chapter: Chapter 4 by R. Ritts et al., entitled, Complementary Merged Bicmos Devices and Circuits, pp. 31–45, Sep. 1990.
"Process Design for Merged Complementary BIC-MOD," by N. Rovendo et al., Technical Digest of the International Electron Devices Meeting, Dec. 9–12, 1990, pp. 485–488.

*Primary Examiner*—Edward J. Wojciechowicz
*Attorney, Agent, or Firm*—Patricia S. Goddard

[57] ABSTRACT

A semiconductor device (10) has a bipolar transistor merged with an MOS transistor, the two transistors being separated essentially by a sidewall spacer and the bipolar transistor being self-aligned to the MOS transistor. The MOS transistor includes a gate (22) and a sorce region (38). A drain region of the MOS transistor is also an active base region (27) of the bipolar transistor. The bipoloar transistor further includes a first emitter region (40) formed in the active base region and a second emitter region (32) which is formed on the first emitter region and partially overlies the MOS transistor gate. The second emitter region is separated from the gate by a sidewall spacer (29) and an overlying dielectric layer (23).

19 Claims, 3 Drawing Sheets

SEMICONDUCTOR DEVICE HAVING MERGED BIPOLAR AND MOS TRANSISTORS AND PROCESS FOR MAKING THE SAME

FIELD OF THE INVENTION

The present invention relates to semiconductor devices in general, and more specifically to semiconductor devices having both bipolar and MOS (metal oxide semiconductor) transistors and processes for making the same.

BACKGROUND OF THE INVENTION

BiMOS (bipolar-MOS) and BiCMOS (bipolar-complementary MOS) semiconductor devices are devices which utilize both bipolar and MOS transistors. BiCMOS refers to devices having N-channel (NMOS) and P-channel (PMOS) transistors, or in other words complementary transistors, while BiMOS typically has one of either NMOS or PMOS transistors. BiMOS and BiCMOS devices are becoming increasingly popular, in part because MOS transistors are reaching performance and manufacturing limitations as the size of the transistors are reduced. For example, smaller transistors require thinner gate oxides. However, as the gate oxide thickness is decreased it is more difficult to grow oxides which are free of defects. As another example, doping concentration is typically increased as transistor gates are scaled; however, increased doping results in decreased carrier mobility. One way of overcoming some of these scaling and performance limitations is to combine MOS transistors with bipolar transistors to form BiMOS or BiCMOS devices. BiMOS and BiCMOS devices have advantages associated with bipolar transistors, such as faster speed and higher current driving capability, in addition to advantages associated with MOS transistors, such as low power consumption. Unfortunately, combining bipolar and MOS transistors also has disadvantages, two of which are an increase in manufacturing complexity and an increase in overall device size.

As a way of reducing the size of BiMOS and BiCMOS devices and reducing the number of manufacturing steps necessary to fabricate such devices, semiconductor manufacturers have begun to merge various components of bipolar and MOS transistors. Historically, BiMOS and BiCMOS devices utilized bipolar transistors which were extensively isolated from MOS transistors. However, isolating the two types of transistors resulted in a rather large overall device size. As the need for smaller devices grew, semiconductor manufacturers realized that extensive isolation between bipolar and MOS transistors was not necessary and began to form the two transistors closer and closer together. Beyond having closely spaced bipolar and MOS transistors, manufacturers also found that it is feasible to merge the two types of transistors such that components are shared to further reduce overall device size. For example, one known BiMOS device forms an N-well which functions both as a collector for an NPN bipolar transistor and a bulk region for a PMOS transistor. Another commonly shared component is a P+ diffusion region which serves as an extrinsic base for an NPN bipolar transistor and as a source/drain for a PMOS transistor. Similarly, complementary transistors, namely PNP bipolar transistors and NMOS transistors have been made with shared components which are comparable to those mentioned above.

While some components of bipolar and MOS transistors are known to be shared, there is still an ongoing need for semiconductor manufacturers to reduce the size of semiconductor devices. To achieve the advantages of both bipolar and MOS transistors while satisfying demand for small devices, it is necessary to merge the two types of transistors beyond levels which are known in the art.

SUMMARY OF THE INVENTION

The present invention combines the advantages of bipolar and MOS transistors in a semiconductor device while minimizing device size. A reduced device size is accomplished by merging a bipolar and an MOS transistor such that the two transistors are essentially separated by a sidewall spacer. In one embodiment of the invention, a semiconductor device has a semiconductor substrate of a first conductivity which serves as both a collector for a bipolar transistor and a bulk region of an MOS transistor. An MOS gate overlies the semiconductor substrate and is separated from the substrate by a gate dielectric. The MOS gate has an overlying dielectric layer and a sidewall spacer formed adjacent a first edge of the MOS gate. An active base region of the bipolar transistor has a second conductivity and is formed in the semiconductor substrate and self-aligned to the first edge of the MOS gate. The active base region also functions as a drain region for the MOS transistor. A first emitter region of the bipolar transistor has the first conductivity and is formed in the active base region and is self-aligned to the sidewall spacer. A second emitter region of the bipolar transistor has the first conductivity and is formed on the first emitter region and partially over the MOS gate. The second emitter region is separated from the MOS gate by the sidewall spacer and the overlying dielectric layer. The device also has a source region of the MOS transistor which is of the second conductivity.

These and other features, and advantages, will be more clearly understood from the following detailed description taken in conjunction with the accompanying drawings. It is to be understood that the illustrations are not necessarily drawn to scale, but are drawn to clearly depict various embodiments of the invention.

DETAILED DESCRIPTION OF A PREFERRED EMBODIMENT

As mentioned previously, known BiMOS and BiCMOS devices have combined or merged similar components in order to reduce space occupied in the device by bipolar and MOS transistors. Known mergers include combining a bipolar collector with an MOS bulk region and combining a bipolar extrinsic base region with an MOS source/drain diffusion. Although each of the above mentioned mergers have provided a reduction in BiMOS and BiCMOS device size, an ongoing need exists for device size to be reduced even further. The present invention fulfills the aforementioned need by utilizing each of the known mergers mentioned above and additionally merges a bipolar active base region with an MOS lightly doped drain (LDD) region. Furthermore, the invention establishes a bipolar transistor which is self-aligned to the MOS transistor. Having these two transistors self-aligned enables the transistors to be formed much closer to one another than in existing BiMOS and BiCMOS devices. In the present invention, a bipolar transistor partially overlies an MOS transistor and the two are essentially separated by a sidewall spacer which is on the order of 0.2 μm. Conventional BiMOS and BiCMOS devices, on the other hand, have transistors which are formed adjacent to one another such that the space which separates two transistors is determined lithographically. Lithographically defined spaces can be formed with dimensions of about 0.5 μm, but have yet to achieve dimensions on the order of 0.2 μm. Therefore, the present invention provides a reduction in overall size of BiMOS and BiCMOS semiconductor devices. As BiMOS and BiCMOS device size is reduced, base resistance is reduced as is capacitance between the base and collector which in turn improve device performance by increasing device speed.

Figure 1:
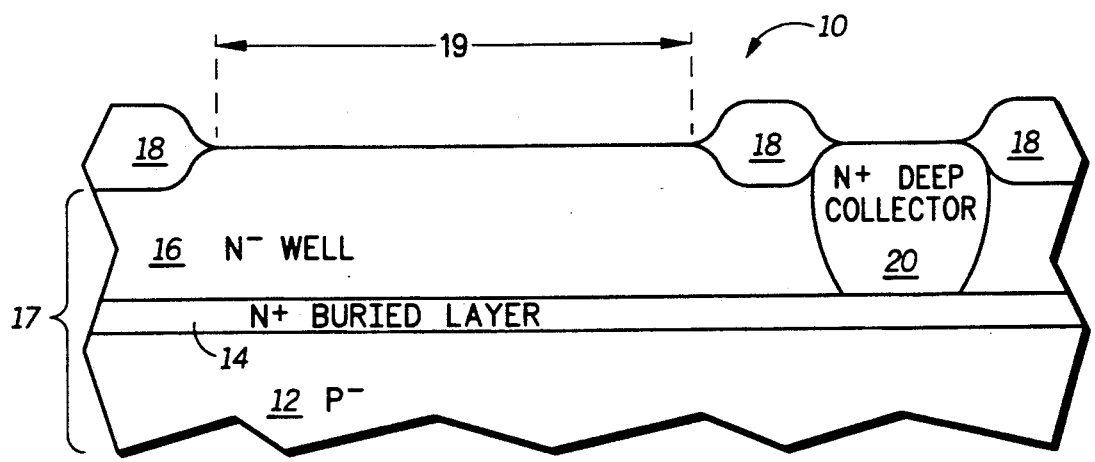
FIGS. 1-5 are cross-sectional views of a portion of a semiconductor device illustrating a process for forming merged bipolar and MOS transistors in accordance with the present invention.

Illustrated in FIGS. 1-5 are cross-sectional views of a portion of a semiconductor device which will aid in understanding the present invention. This series of figures represents a process for making a BiMOS or BiCMOS device in accordance with the invention. FIG. 1 illustrates an initial structure which is suitable for use in a semiconductor device in accordance with the present invention. A portion of a semiconductor device 10 illustrated in FIG. 1 includes a monocrystalline silicon substrate 12 which is lightly dope with a P-type impurity and is thus labeled "P−". An N+ buried layer 14 is formed in substrate 12 by doping the substrate with an N-type impurity by, for example, diffusion or ion implantation of arsenic or phosphorus. Following formation of buried layer 14, an epitaxial silicon layer is grown to form a well 16 which incorporates some of the dopants from buried layer 14 and is thus labeled "N−WELL". In order to achieve a particular doping concentration in well 16, the epitaxial layer may be doped separately, for instance by a blanket ion implantation, rather than relying upon diffusion from the buried layer.

Silicon substrate 12, buried layer 14 and well 16 collectively form a semiconductor substrate 17. The dopant types described in reference to and illustrated in FIG. 1 represent dopants types used in the formation of PMOS transistors and NPN bipolar transistors. However, it is to be understood that the present invention may also be implemented using NMOS transistors and/or PNP bipolar transistors simply by changing the dopant species. Likewise, the present invention may be used to form complementary BiCMOS (C-BiCMOS) devices which incorporate both NPN and PNP bipolar transistors along with NMOS and PMOS transistors.

As FIG. 1 also illustrates, field oxide regions 18 are formed in device 10 to define an active device region 19 within semiconductor substrate 17. Field oxide regions 18 may be formed using any of the available isolation oxide techniques, for example by LOCOS (localized oxidation of silicon). A deep collector 20 is formed between two of the field oxide regions in order to provide a way of contacting buried layer 14. Deep collector 20 is doped with an N-type impurity in the case of forming an NPN bipolar transistor.

Figure 2:
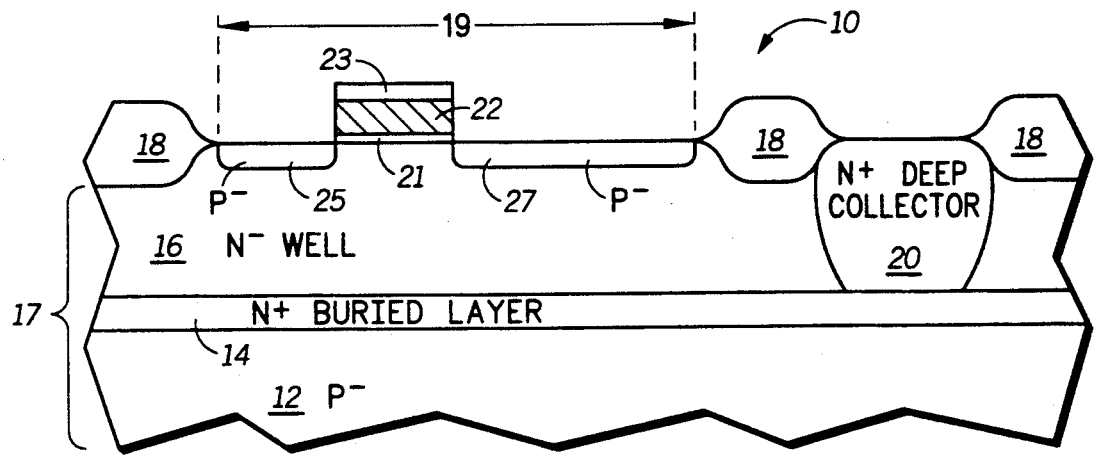

FIG. 2 illustrates the next series of processing steps used to fabricate device 10 in accordance with the present invention. An MOS gate 22 is formed overlying active device region 19 of semiconductor substrate 17 and is separated from the substrate by a gate dielectric 21. MOS transistor gates are typically made of polysilicon, but other conductive materials may be used. Above the gate is an overlying dielectric layer 23 which is used to electrically isolate the gate from overlying conductive layers (not shown in FIG. 2). The overlying dielectric layer may be conveniently formed at the same time as gate 22 by depositing a conductive material for the gate and an insulating material for the dielectric layer and simultaneously patterning both layers. Suitable materials for overlying dielectric layer 23 include $SiO_2$, $Si_3N_4$, TEOS (tetra-ethyl-ortho-silicate), or the like. After forming the gate, a lighted doped source region 25 of the MOS transistor and an active base region 27 of the bipolar transistor are simultaneously formed in active device region 19 and are self-aligned to the MOS gate. The source region 25 and active base region 27 are lightly doped with a P-type impurity and may be formed by ion implantation or diffusion of, for example, boron. Active base region 27 also functions as an LDD (lightly doped drain) of the MOS transistor. Merging of the bipolar active base regions with the MOS LDD regions is possible because impurity concentrations for these two regions in individual bipolar and MOS devices are converging. A reasonable impurity concentration of, for example, boron which serves as both an active base region and an LDD region in a device of the present invention is on the order of $2 \times 10^{13}/cm^2$, which may be accomplished by ion implantation at an energy of 20 KeV or less.

Figure 3:
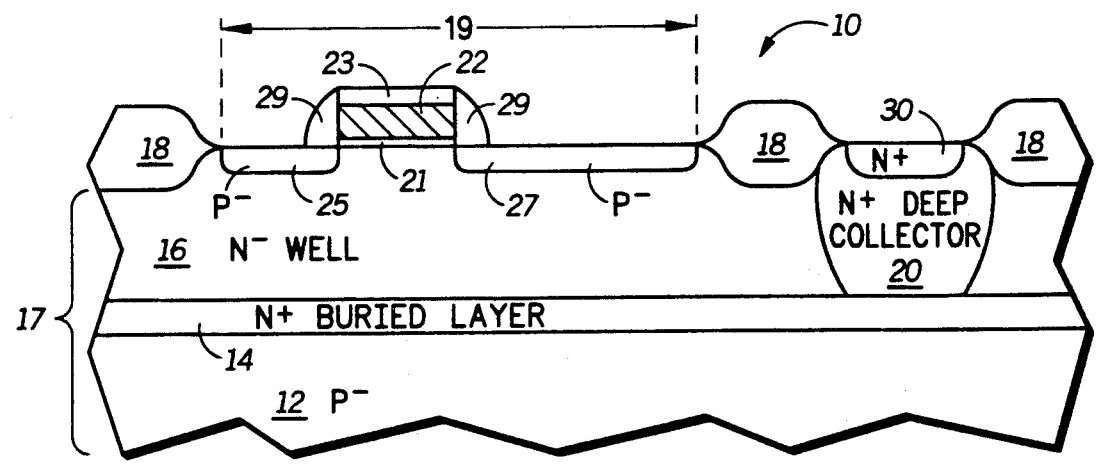

As illustrated in FIG. 3, sidewall spacers 29 are formed along edges of MOS gate 22 and overlying dielectric layer 23. The sidewall spacers are formed in a conventional manner by depositing an insulating material such as $SiO_2$ or $Si_3N_4$ and performing a one-directional or anisotropic etch. Like overlying dielectric layer 23, sidewall spacers 29 are used to electrically isolate MOS gate 22 from other conductive materials (not shown in FIG. 3). A collector region 30 is also formed in the semiconductor substrate within deep collector 20. Collector region 30 is heavily doped with an N-type impurity but is usually of a higher concentration than the deep collector and thus is illustrated as a separate element. Whether the collector contact region is formed before or after the formation of sidewall spacers 29 is not important in practicing the invention.

Figure 4:
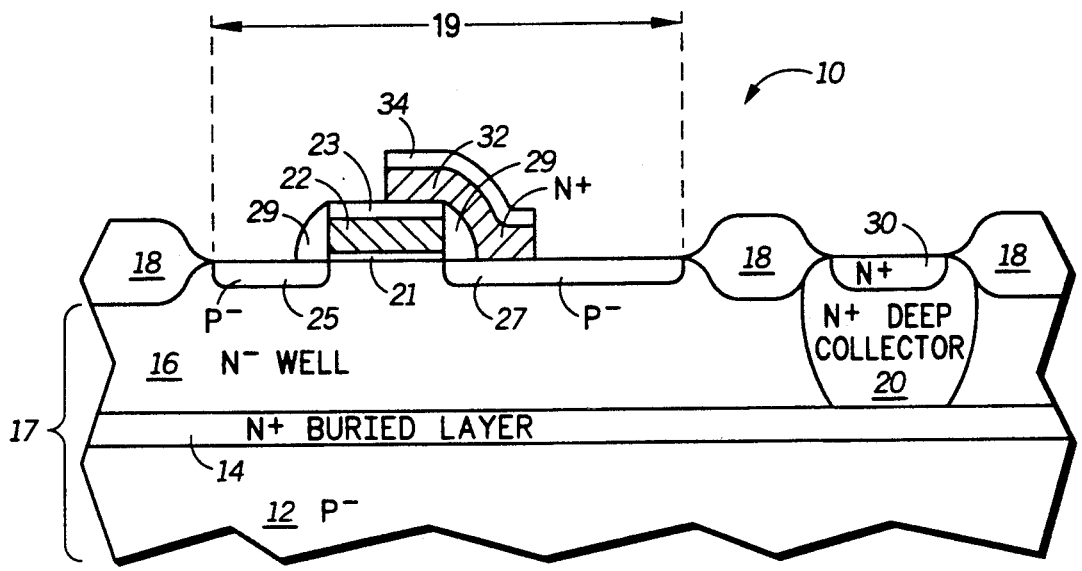

FIG. 4 illustrates the formation of an emitter 32 of the bipolar transistor. Emitter 32 is formed on a portion of active base region 27 and partially overlies MOS gate 22. The emitter is separated from the gate by overlying dielectric layer 23 and one of the sidewall spacers 29. In a preferred embodiment of the present invention, MOS gate 22 is formed from a first polysilicon layer while emitter 32 is formed from a second polysilicon layer. Forming the bipolar emitter over the MOS gate is advantageous from at least two points of view. Firstly, having the emitter overlap the gate establishes a significant savings in space occupied by the bipolar and MOS transistor which results in smaller overall device size. Existing BiMOS and BiCMOS devices can only have the emitter and gate separated a distance which is determined by lithographic resolution limits, or in other words the smallest separation distance is the smallest lithographically resolvable print dimension. The present invention goes beyond the lithographic resolution lower limit by separating the emitter and gate by a sidewall spacer in conjunction with a dielectric layer overlying the gate. With existing spacer technology, an emitter and gate of a device formed in accordance with the present invention can be separated by a dimension on the order of 0.2 μm, whereas the lower limit of existing lithography equipment is considered to be on the order of 0.5 μm. Secondly, having the emitter overlap the gate creates a bipolar emitter which is self-aligned to the MOS gate. Self-aligned structures are advantageous because alignment tolerances are relaxed. For example in reference to FIG. 4, it is not critical that emitter 32 be positioned exactly as illustrated. Emitter 32 may be offset to either the left or right and still function properly as a bipolar emitter. Of course there is a limit as to the degree of offset or misalignment permissible. This limit is determined by the amount of offset which can occur while still having a resonable portion of emitter 32 in contact with active base region 27.

FIG. 4 further illustrates that emitter 32 is doped with an N-type impurity in forming an NPN bipolar transistor. Emitter doping may be accomplished by in-situ doping during deposition of the emitter material or a subsequent diffusion or ion implantation after the emitter material has been deposited. Like the MOS gate, emitter 32 has an overlying dielectric layer 34 which isolates the emitter from other conductive layers (not shown). The overlying dielectric layer 34 can conveniently be formed at the same time as emitter 32 as discussed earlier with respect to MOS gate 22 and overlying dielectric layer 23. In patterning a conductive layer to form emitter 32, care is needed if the conductive layer is polysilicon in order to avoid substantial etching of an underlying silicon substrate. Polysilicon etches, in general, have a low selectivity to silicon; however, a tightly controlled polysilicon deposition thickness and polysilicon etch rate can be used to avoid substantial etching of the substrate. If desired, emitter 32 and gate 22 may have an overlying refractory metal layer or silicide layer in order to lower resistance.

Figure 5:
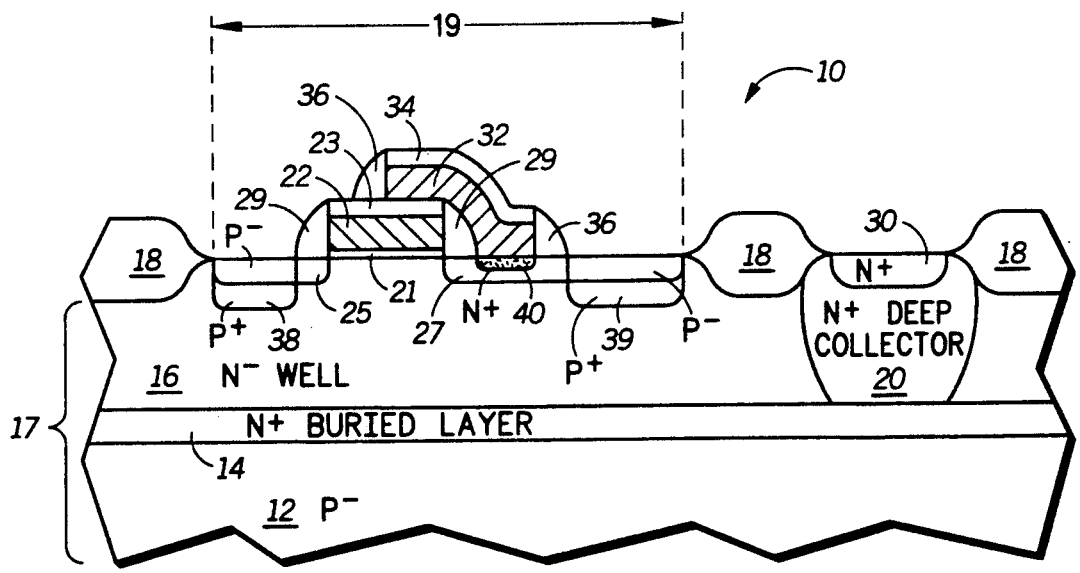

After forming emitter 32, sidewall spacers 36 are formed along edges of the emitter, as FIG. 5 illustrates. The sidewall spacers 36 are formed by methods which are well known in the art. Upon forming sidewall spacers 36, a source region 38 of the MOS transistor and an extrinsic base region 39 of the bipolar transistor are formed in active device region 19 of the semiconductor substrate. Source region 38 and extrinsic base region 39 are heavily doped with a P-type impurity in forming PMOS and NPN bipolar transistors. The doping may be accomplished without a masking step by implanting, for example, boron at an energy or dosage low enough to prevent detrimental doping of emitter 32. A suitable boron implant is $3 \times 10^{15}/cm^2$ at an energy of 15 KeV. Although it is not essential that source and extrinsic base regions be formed after sidewall spacers 36, the presence of the spacers provides for a self-aligned extrinsic base region. Source region 38 is also self-aligned due to the presence of sidewall spacers 29.

Figure 6:
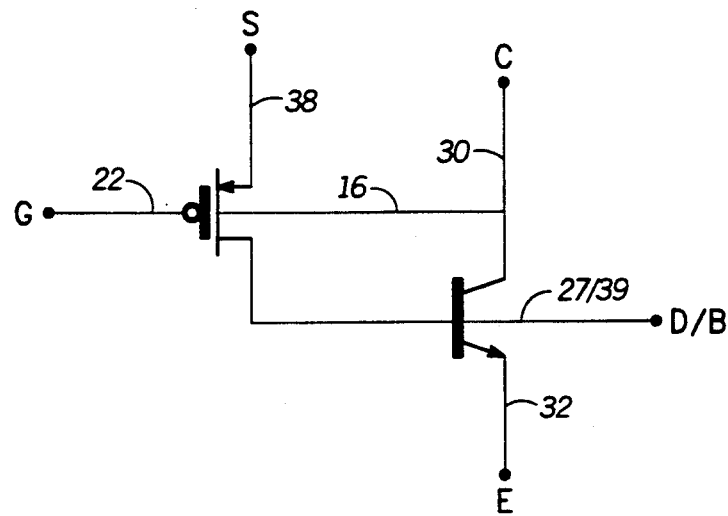
FIG. 6 is a circuit diagram of the bipolar and MOS transistors illustrated in FIG. 5.

After completion of a structure comparable to that illustrated in FIG. 5, various insulating and conducting layers (not shown) are deposited on the device and patterned to complete fabrication of the device. For example, contacts to source region 38, extrinsic base region 39, and collector region 30 are formed along with one or more insulating layers. During a relatively high temperature operation, such as an insulating layer anneal, the impurities in emitter 32 will diffuse into a portion of active base region 27 to form a diffused emitter region 40, as illustrated in FIG. 5. The formation of the diffused emitter region essentially completes fabrication of the bipolar and MOS transistors. The bipolar transistor includes a collector region 30, an active base region 27, an extrinsic base region 39, and an emitter 32. The MOS transistor includes gate 22, a source region formed by regions 25 and 38, and a drain region formed by region 27, with the channel region being made up of the portion of well 16 located between regions 25 and 27. A circuit diagram illustrating the MOS and bipolar transistors of FIG. 5 is illustrated in FIG. 6 with the corresponding numberical labels for the transistor elements. In FIG. 6, "G" represents the gate of a transistor, "S" represents the source, "C" represents the collector, etc.. As apparent in FIG. 6, embodiments of the present invention incorporate a drain region 27 which is merged with a base region 39 and utilizes a bulk region 16 which is shared by collector region 30.

Figure 7:
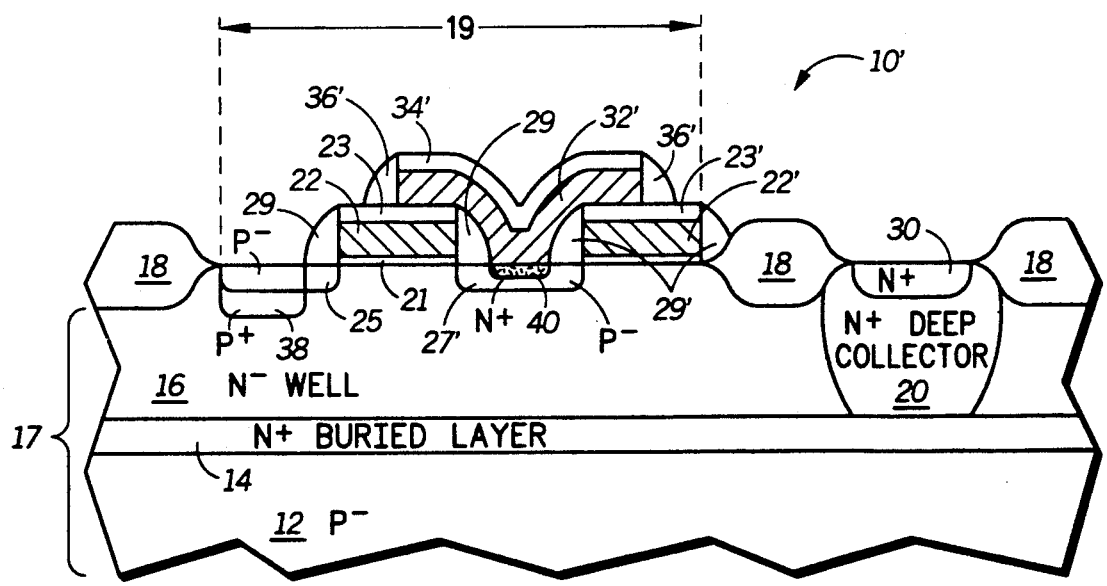
FIG. 7 is a cross-sectional view of a portion of a semiconductor device illustrating another embodiment of the present invention.

FIG. 7 illustrates another embodiment of the present invention in which an emitter is formed between two conductive members, much like a self-aligned contact might formed in a device. A portion of a semiconductor device 10' is illustrated with many of the same elements of the previous embodiment. Analogous elements of the two embodiments are labeled the same in each of the figures. Those elements which have been modified from the previous embodiment have been primed. In semiconductor device 10', an emitter 32' is formed on active base region 27 and partially overlies MOS gate 22. Additionally, the emitter also partially overlies a conductive member 22' which is formed at the same time gate 22 is formed. Conductive member 22' does not necessarily function as an active element in either the bipolar or MOS transistor as illustrated in FIG. 7, but may be essential to a portion of device 10' which is not shown. For example, conductive member 22' may be used as an MOS transistor gate in another portion of device 10'. Having two adjacent conductive members such as gate 22 and conductive member 22' is common in many semiconductor devices. The present invention takes advantage of the configuration by forming a bipolar emitter between the two conductive members such that emitter 32' is a self-aligned structure.

Like the previous embodiment, the device of FIG. 7 has a significant advantage over existing BiMOS and BiCMOS devices in that device 10' is much more compact. Emitter 32' is separated from MOS gate 22 by one of the sidewall spacers 29 and overlying dielectric layer 23, whereas existing structures have bipolar transistors which are separated from MOS transistors based on a minimum lithography resolution. Another advantage in semiconductor device 10' is that in forming emitter 32', it is not necessary to etch the emitter material selective to the substrate 17. In forming the emitter, the emitter material is etched selective to overlying dielectric layers 23 and 23' which is generally much easier than, for example, etching polysilicon selective to single crystal silicon. Yet another advantage is that the emitter size is determined only by the lithographic space between conductive members 22 and 22' and not by the alignment of emitter 32'.

A difference between semiconductor device 10' of FIG. 7 and semiconductor device 10 of FIG. 5 is that semiconductor device 10' does not have a defined extrinsic base region. It is not always necessary to include an extrinsic base region in certain device applications. However, if an extrinsic base region is desired, active base region 27' may be extended, for example, in a direction perpendicular to FIG. 7. An extrinsic base could then be formed by heavily doping a portion of the extended active base region with a dopant species having the same conductivity as that used in the active base region. If desired, a heavily doped drain region for the MOS transistor may be formed in a similar manner. Likewise, a direct contact to region 27 of the device illustrated in FIG. 5, i.e. a direct drain contact, may be formed in much the same way.

The foregoing description and illustrations contained herein demonstrate many of the advantages associated with the present invention. In particular, it has been demonstrated that the present invention provides a very compact BiMOS or BiCMOS semiconductor device. An emitter of a bipolar transistor can be formed very close to an MOS gate, the two being separated essentially by a spacer. Device size is further reduced by sharing elements between the bipolar and MOS transistors. In the present invention, a bipolar collector is shared with an MOS bulk region, and a bipolar active base is shared with an MOS LDD region. A smaller device size results in lower parasitics while also increasing device speed, both of which are desirable attributes of a BiMOS or BiCMOS device. Another benefit is that devices formed in accordance with the invention are fully self-aligned. More specifically, the bipolar and MOS transistors of the inventive devices are self-aligned to each other. Self-aligned devices have several advantages, including an improvement in device size and less stringent lithographic alignment tolerances. The combination of self-aligned transistors and merged transistor components results in a semiconductor device having reduced base resistance and reduced base/collector capacitance, and thus an increase in signal speed to enhance overall device performance. Yet another advantage is that the present invention can be easily implemented in either BiMOS, BiCMOS, or C-BiCMOS devices by simply altering dopant species.

Thus it is apparent that there has been provided, in accordance with the invention, a semiconductor device having merged bipolar and MOS transistors and a process for making the same that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the invention is not limited to the PMOS and NPN transistors illustrated but may also be used in NMOS, PNP, and complementary transistors. In addition, the invention is not limited to the specific conductive or insulating materials described in reference to the illustrations or to any particular deposition, etching, doping, or lithographic techniques. For example, rather than using only polysilicon to form and MOS gate and bipolar emitter, these two elements may formed of silicide, a combination of polysilicon and silicide, a refractory metal, or a combination of a refractory metal and polysilicon. As another example, doping concentrations and energy levels other than those specifically mentioned may also be suitable in practicing the invention. Therefore, it is intended that this invention encompass all such variations and modifications as fall within the scope of the appended claims.

We claim:
1. A semiconductor device having merged bipolar and MOS transistors, comprising:
   a semiconductor substrate of a first conductivity which functions as a collector of the bipolar transistor and a bulk region of the MOS transistor;
   an MOS gate overlying the semiconductor substrate and separated from the substrate by a gate dielectric, the MOS gate having an overlying dielectric layer and a first sidewall spacer formed adjacent to a first edge of the MOS gate;
   an active base region of the bipolar transistor, the active base region being of a second conductivity and formed in the semiconductor substrate and self-aligned to the first edge of the MOS gate, the active base region also functioning as a drain region for the MOS transistor;
   a first emitter region of the bipolar transistor, the first emitter region being of the first conductivity and formed in the active base region;
   a second emitter region of the bipolar transistor and being of the first conductivity and formed on the first emitter region and partially over the MOS gate, the second emitter region being separated from the MOS gate by the first sidewall spacer and the overlying dielectric layer; and
   a source region of the MOS transistor being of the second conductivity and formed in the semiconductor substrate adjacent a second edge of the MOS gate opposite the first edge.

2. The semiconductor device of claim 1 wherein the MOS gate is comprised of a first polysilicon layer and the second emitter region is comprised of a second polysilicon layer.

3. The semiconductor device of claim 2 further comprising an extrinsic base region formed in the semiconductor substrate and self-aligned to a second sidewall spacer which is adjacent a first edge of the second emitter region.

4. The semiconductor of claim 1 wherein the semiconductor substrate is comprised of an epitaxial silicon layer.

5. The semiconductor device of claim 1 wherein the active base region of the bipolar transistor also functions as a lightly doped drain region of the MOS transistor.

6. The semiconductor device of claim 1 wherein the source region of the MOS transistor is self-aligned to the second edge of the MOS gate.

7. The semiconductor device of claim 1 wherein the source region of the MOS transistor is self-aligned to a second sidewall spacer which is adjacent the second edge of the MOS gate.

8. A semiconductor device having merged bipolar and MOS transistors, comprising:
   a semiconductor substrate of a first conductivity which functions as a collector of the bipolar transistor and a bulk region of the MOS transistor;
   first and second conductive members separated by a space and overlying the semiconductor substrate, each conductive member having an overlying dielectric layer, the first conductive member functioning as an MOS gate;
   an active base region of the bipolar transistor, the active base region being of a second conductivity and formed in the semiconductor substrate and within the space between the two conductive members, the active base region also functioning as a drain region for the MOS transistor;

a first emitter region of the bipolar transistor, the first emitter region being of the first conductivity and formed in the active base region;

a second emitter region of the bipolar transistor, the second emitter region being of the first conductivity and formed on the first emitter region, substantially filling the space between the two conductive members and partially overlying both conductive members, the second emitter region being separated from the first and second conductive members by a sidewall spacer formed on each of two opposing first edges of the first and second conductive members, respectively, and by the overlying dielectric layers; and a source region of the MOS transistor formed in the semiconductor substrate and adjacent a second edge of the MOS gate.

9. The semiconductor device of claim 8 wherein the two conductive members are comprised of a first polysilicon layer and the second emitter region is comprised of a second polysilicon layer.

10. The semiconductor device of claim 8 wherein the semiconductor substrate is comprised of an epitaxial silicon layer.

11. The semiconductor device of claim 8 wherein the active base region of the bipolar transistor also functions as a lightly doped drain region of the MOS transistor.

12. The semiconductor device of claim 8 wherein the source region of the MOS transistor is self-aligned to the second edge of the MOS gate.

13. The semiconductor device of claim 8 wherein the source region of the MOS transistor is self-aligned to a second sidewall spacer which is adjacent the second edge of the MOS gate.

14. A process for making a semiconductor having merged bipolar and MOS transistors, comprising the steps of:

providing a semiconductor substrate of a first conductivity which functions as both a collector of the bipolar transistor and a bulk region of the MOS transistor;

forming a gate of the MOS transistor which overlies the semiconductor substrate and is separated from the substrate by a gate dielectric, the gate having an overlying dielectric layer;

forming in the semiconductor substrate an active base region of the bipolar transistor, the active base region being of a second conductivity and self-aligned to a first edge of the MOS transistor, the active base region also functioning as a drain region of the MOS transistor;

forming first and second sidewall spacers adjacent the first edge and a second edge of the MOS gate, respectively;

depositing and patterning a conductive material to form a first emitter region of the bipolar transistor on the active base region and partially overlying the MOS gate, the first emitter region being of the first conductivity and separated from the MOS gate by the first sidewall spacer and the overlying dielectric layer;

forming in the active base region and under the first emitter region a second emitter region of the bipolar transistor, the second emitter region being of the first conductivity; and forming in the semiconductor substrate, and adjacent the second edge of the MOS gate, a source region of the MOS transistor, the source region being of the second conductivity.

15. The process of claim 14 wherein the step of providing a semiconductor substrate comprises providing a single crystalline semiconductor substrate comprised of a silicon epitaxial layer.

16. The process of claim 14 further comprising the step of forming third and fourth sidewall spacers adjacent first and second edges of the first emitter region.

17. The process of claim 16 wherein the step of forming a source region of the MOS transistor comprises simultaneously forming a source region of the MOS transistor which is self-aligned to the second sidewall spacer and an forming extrinsic base region of the bipolar transistor which is self-aligned to third sidewall spacer.

18. The process of claim 14 wherein the step of forming a gate of the MOS transistor comprises depositing and patterning a first polysilicon layer, and the step of depositing and patterning a conductive material to form a first emitter region of the bipolar transistor comprises depositing and patterning a second polysilicon layer.

19. The process of claim 14 wherein the step of forming an active base region comprises forming an active base region of the bipolar transistor which also functions as a lightly doped drain region of the MOS transistor.

* * * * *